(12) United States Patent (10) Patent No.: US 11,785,721 B2
Kondoh et al. (45) Date of Patent: Oct. 10, 2023

(54) METHOD FOR MANUFACTURING WIRING BOARD

(71) Applicant: TOYOTA JIDOSHA KABUSHIKI KAISHA, Toyota (JP)

(72) Inventors: Haruki Kondoh, Okazaki (JP); Rentaro Mori, Kasugai (JP); Keiji Kuroda, Toyota (JP); Kazuaki Okamoto, Toyota (JP); Akira Kato, Toyota (JP); Jyunya Murai, Nisshin (JP); Hiroshi Yanagimoto, Miyoshi (JP); Kenji Nakamura, Toyota (JP); Tomoya Okazaki, Nagakute (JP)

(73) Assignee: TOYOTA JIDOSHA KABUSHIKI KAISHA, Toyota (JP)

(*) Notice: Subject to any disclaimer, the term of this patent is extended or adjusted under 35 U.S.C. 154(b) by 0 days.

(21) Appl. No.: 17/672,067

(22) Filed: Feb. 15, 2022

(65) Prior Publication Data

US 2022/0272847 A1 Aug. 25, 2022

(30) Foreign Application Priority Data

Feb. 19, 2021 (JP) ................................ 2021-025668

(51) Int. Cl.
*H05K 3/10* (2006.01)
*C25D 5/02* (2006.01)
(Continued)

(52) U.S. Cl.
CPC ............ *H05K 3/108* (2013.01); *C25D 5/022* (2013.01); *C25D 7/00* (2013.01); *H05K 3/18* (2013.01);
(Continued)

(58) Field of Classification Search
None
See application file for complete search history.

(56) References Cited

U.S. PATENT DOCUMENTS

| 4,877,644 A | 10/1989 | Wu et al. |
| 2002/0197492 A1* | 12/2002 | Hao ..................... C25D 5/022 428/457 |

(Continued)

FOREIGN PATENT DOCUMENTS

| CN | 106061124 A | 10/2016 |
| CN | 112144091 A | 12/2020 |

(Continued)

OTHER PUBLICATIONS

Law, J. Phys. Chem. Lett. 2014, 5, 686-688 (Year: 2014).*

*Primary Examiner* — Louis J Rufo
(74) *Attorney, Agent, or Firm* — Sughrue Mion, PLLC

(57) ABSTRACT

First, a patterned substrate including an insulating substrate, a conductive seed layer, and an insulating layer is prepared. The seed layer is disposed on the insulating substrate, and consists of a first part having a predetermined pattern corresponding to the wiring pattern and a second part as a part other than the first part. The insulating layer is disposed on the second part of the seed layer. Subsequently, a metal layer having a thickness larger than a thickness of the insulating layer is formed on the first part of the seed layer. Here, a voltage is applied between an anode and the seed layer while a resin film containing a metal ion-containing solution is disposed between the patterned substrate and the anode and the resin film and the seed layer are brought into pressure contact. Subsequently, the insulating layer and the second part of the seed layer are removed.

11 Claims, 13 Drawing Sheets

(51) Int. Cl.
*C25D 7/00* (2006.01)
*H05K 3/18* (2006.01)

(52) U.S. Cl.
CPC ........... *H05K 2203/0723* (2013.01); *H05K 2203/107* (2013.01)

(56) References Cited

U.S. PATENT DOCUMENTS

| | | | |
|---|---|---|---|
| 2006/0065534 A1* | 3/2006 | Nakai | C25D 5/02 |
| | | | 204/225 |
| 2006/0163725 A1 | 7/2006 | Haba et al. | |
| 2016/0090660 A1 | 3/2016 | Mitra et al. | |
| 2016/0289840 A1 | 10/2016 | Sato et al. | |
| 2016/0330845 A1* | 11/2016 | Okade | C25D 7/00 |
| 2020/0407866 A1 | 12/2020 | Ikuta et al. | |
| 2021/0084774 A1 | 3/2021 | Okamoto et al. | |
| 2021/0305040 A1* | 9/2021 | Kuo | G03F 7/0042 |
| 2021/0392753 A1 | 12/2021 | Kondoh et al. | |

FOREIGN PATENT DOCUMENTS

| | | | | |
|---|---|---|---|---|
| JP | 2683696 B2 | 12/1997 | | |
| JP | 2008-258483 A | 10/2008 | | |
| JP | 2015-170713 A | 9/2015 | | |
| JP | 2016-225524 A | 12/2016 | | |
| JP | 2017226918 A | * 12/2017 | ............ | C25D 1/10 |
| JP | 2021-048210 A | 3/2021 | | |
| JP | 2021-197424 A | 12/2021 | | |

\* cited by examiner

METHOD FOR MANUFACTURING WIRING BOARD

CROSS REFERENCE TO RELATED APPLICATIONS

The present application claims priority from Japanese patent application JP 2021-025668 filed on Feb. 19, 2021, the entire content of which is hereby incorporated by reference into this application.

BACKGROUND

Technical Field

The present disclosure relates to a method for manufacturing a wiring board.

Background Art

As a method for manufacturing a wiring board, a subtractive method, a semi-additive method, and a full-additive method have been known. Generally, for the manufacture of a high-density wiring board, the semi-additive method is used.

JP 2016-225524 A discloses a method for manufacturing a wiring board using a semi-additive method. Specifically, a base layer, a dielectric layer, a seed layer, and a first plated layer are deposited in this order, a patterned resist is formed on the first plated layer by a photolithography method, a second plated layer is formed on a part of the first plated layer which is exposed from the patterned resist, subsequently, the patterned resist is removed, and the first plated layer and the seed layer are removed using the second plated layer as a mask, thus manufacturing a wiring board.

SUMMARY

In the semi-additive method using the plating method as disclosed in JP 2016-225524 A, it is necessary to form a patterned resist having a thickness equal to or more than a thickness of a second plated layer to be formed. However, forming the patterned resist having the large thickness requires many processes. In addition, removing the patterned resist not only requires the many processes, but also generates a large amount of waste liquid.

Therefore, a method for manufacturing a wiring board that allows reduction of a thickness of a resist (insulating layer) is provided.

According to one aspect of the present disclosure, there is provided a method for manufacturing a wiring board including an insulating substrate and a wiring layer. The wiring layer is disposed on the insulating substrate and has a predetermined wiring pattern. The method comprises:
  preparing a patterned substrate;
  wherein the patterned substrate includes:
    the insulating substrate,
    a conductive seed layer disposed on the insulating substrate, the seed layer consisting of a first part having a predetermined pattern corresponding to the wiring pattern and a second part as a part other than the first part, and
    an insulating layer disposed on the second part of the seed layer;
  forming a metal layer on the first part of the seed layer, the metal layer having a thickness larger than a thickness of the insulating layer, wherein a voltage is applied between an anode and the seed layer while a resin film containing a metal ion-containing solution is disposed between the patterned substrate and the anode and the resin film and the seed layer are brought into pressure contact with each other; and
  removing the insulating layer and the second part of the seed layer.

With the method for manufacturing a wiring board of the present disclosure, the thickness of the insulating layer can be reduced.

DETAILED DESCRIPTION

Embodiments

Figure 1:
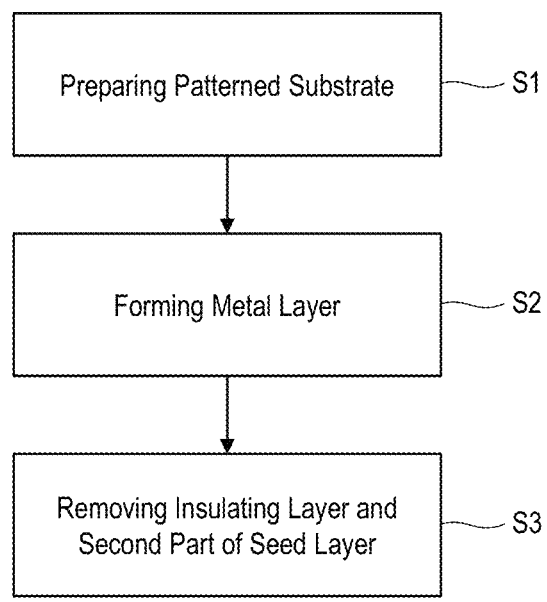
FIG. 1 is a flowchart illustrating a method for manufacturing a wiring board according to an embodiment.

The following describes embodiments with reference to the drawings as necessary. In the drawings referred in the following description, the same reference numerals are attached to the same members or members having similar functions, and the repeated descriptions will be omitted in some cases. For convenience of explanation, dimensional ratios of the drawings are different from the actual ratios, and the members are partially omitted from drawings in some cases. In this application, a numerical range indicated using the term "to" includes respective values described before and after the term "to" as the lower limit value and the upper limit value.

Figure 2:
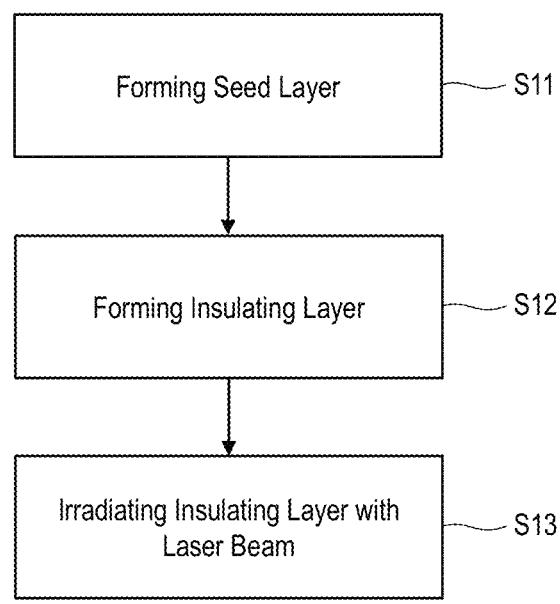
FIG. 2 is a flowchart illustrating a step of preparing a patterned substrate in the method for manufacturing a wiring board according to the embodiment.

As illustrated in FIG. 1, a method for manufacturing a wiring board of the embodiment includes: a step of preparing a patterned substrate (S1), a step of forming a metal layer (S2), and a step of removing an insulating layer and a second part of a seed layer (S3). As illustrated in FIG. 2, the step of preparing the patterned substrate (S1) may include a step of forming the seed layer (S11), a step of forming the insulating layer (S12), and a step of irradiating the insulating layer with a laser beam (laser light) (S13). The following describes each of the steps.

(1) Step of Preparing Patterned Substrate (S1)

a) Forming Seed Layer (S11)

Figure 3:
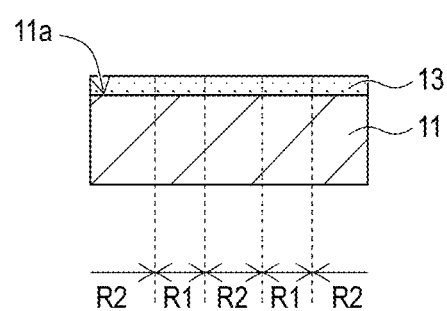
FIG. 3 is a conceptual diagram illustrating a step of forming a seed layer.

First, as illustrated in FIG. 3, a seed layer 13 is formed on an insulating substrate 11.

For the insulating substrate 11, for example, a substrate containing a resin and a glass, such as a glass epoxy resin substrate; a resin substrate; and a glass substrate are usable. Examples of the resin used for the insulating substrate 11 include a thermoplastic resin such as a PET resin, a PI resin, a LCP (liquid crystal polymer), an epoxy resin, an ABS resin, an AS resin, an AAS resin, a PS resin, an EVA resin, a PMMA resin, a PBT resin, a PPS resin, a PA resin, a POM resin, a PC resin, a PP resin, a PE resin, a polymer alloy resin containing elastomer and PP, a denatured PPO resin, a PTFE resin, an ETFE resin, and the like; a thermosetting resin such as a phenol resin, a melamine resin, an amino resin, an unsaturated polyester resin, polyurethane, diallyl phthalate, a silicone resin, an alkyd resin, and the like; a resin in which a cyanate resin is added to an epoxy resin, and the like.

The material of the seed layer 13 is not specifically limited insofar as the material has a conductive property, and the seed layer 13 can be etched in the step (S3) described later. For example, the material of the seed layer 13 may be Pt, Pd, Rh, Cu, Ag, Au, Ti, Al, Cr, Si, or an alloy of them, a silicide such as $FeSi_2$, $CoSi_2$, $MoSi_2$, $WSi_2$, $VSi_2$, $ReSi_{1.75}$, $CrSi_2$, $NbSi_2$, $TaSi_2$, $TiSi_2$, and $ZrSi_2$, especially, a transition metal silicide, a conductive metal oxide such as $TiO_2$, SnO, GeO, and ITO (indium tin oxide), or a conductive resin. To cause the seed layer 13 having the sufficient thickness to remain in the step (S13) of irradiating with the laser beam described later, the seed layer 13 may have the thickness of 80 nm or more, and 100 nm or more in some embodiments. From the aspect of the manufacturing cost, the seed layer 13 may have the thickness of 1000 nm or less, and 500 nm or less in some embodiments.

The seed layer 13 may be formed on the whole of a main surface 11a of the insulating substrate 11. The seed layer 13 may be formed by any method. The seed layer 13 can be formed by, for example, a physical vapor deposition (PVD) method such as a sputtering method, a chemical vapor deposition (CVD) method, and an electroless plating method. Alternatively, the seed layer 13 can also be formed by applying a dispersion liquid of conductive particles over the main surface 11a of the insulating substrate 11 and solidifying the dispersion liquid. As a dispersion medium of the dispersion liquid, a liquid volatilizable by heating, for example, decanol, is usable. The dispersion liquid may contain an additive. Examples of the additive include straight chain fatty acid salts with 10 to 17 carbon atoms. The method for applying the dispersion liquid is not specifically limited. Examples of the method include a die coating method, a dip coating method, and a spin coating method. The method for solidifying the dispersion liquid is not specifically limited. For example, the dispersion liquid can be solidified by volatilizing the dispersion medium and sintering the conductive particles by heating.

As illustrated in FIG. 3, the seed layer 13 consists of a first part R1 and a second part R2, which is a part other than the first part R1. The first part R1 has a predetermined pattern corresponding to a wiring pattern of a wiring board manufactured by the manufacturing method of the embodiment.

To improve the adhesion between the seed layer 13 and the insulating substrate 11, the main surface 11a of the insulating substrate 11 may be subjected to a surface treatment before forming the seed layer 13. For example, a layer of a primer or the like may be formed on the main surface 11a of the insulating substrate 11. As the primer, polyimide, polyamide imide, and the like are usable. The main surface 11a of the insulating substrate 11 may be roughened. The roughening can be performed by a laser irradiation, an etching, a desmear process, a machining (polishing, grinding), and the like.

b) Forming Insulating Layer (S12)

Figure 4:
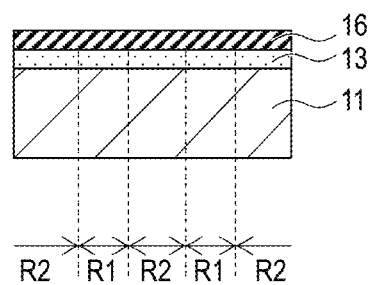
FIG. 4 is a conceptual diagram illustrating a step of forming an insulating layer.

As illustrated in FIG. 4, an insulating layer 16 is formed on the seed layer 13. That is, the insulating layer 16 is formed on both of the first part R1 and the second part R2 of the seed layer 13.

The material of the insulating layer 16 is not specifically limited insofar as the material has an insulating property and is removable by the laser beam irradiation. Examples of the material of the insulating layer 16 include a thermosetting resin such as an EP (epoxy) resin, a resol-type PF (phenol) resin, a UF (urea-formaldehyde) resin, a MF (melamine) resin, a UP (unsaturated polyester) resin, a PUR (polyurethane) resin, a DAP (diallyl phthalate) resin, a SI (silicone) resin, an ALK (alkyd) resin, a thermosetting PI (polyimide) resin, a PPO (polyphenylene oxide) resin, a LCP (liquid crystal polymer), a PTFE (polytetrafluoroethylene) resin, and the like, and a thermoplastic resin such as a PE (polyethylene) resin, a PP (polypropylene) resin, a PS (polystyrene) resin, a PET (polyethylene terephthalate) resin, an AS (acrylonitrile-styrene copolymer) resin, an ABS (acrylonitrile-butadiene-styrene copolymer) resin, a PVC (polyvinyl chloride) resin, a PVDC (the polyvinylidene chloride) resin, an acrylic resin (for example, PMMA (polymethylmethacrylate) resin), a novolak-type PF resin, and the like.

The insulating layer 16 can be formed by any method such as a die coating method, a dip coating method, a spin coating method, or the like. The insulating layer 16 can be formed also by laminating an insulating film, such as a dry film resist, on the seed layer 13.

The insulating layer 16 has a thickness smaller than that of a metal layer 14 formed by the step (S2) of forming the metal layer described later. The insulating layer 16 may have the thickness of less than 12.5 μm, 10 μm or less, or 7 μm or less. This allows the insulating layer 16 on the first part R1 of the seed layer 13 to be removed to expose the first part R1 of the seed layer 13 in the subsequent step (S13) of irradiating the insulating layer 16 with the laser beam. From the aspect of ensuring the sufficient insulating property, the insulating layer 16 may have the thickness of 0.5 μm or more, especially, 1 μm or more.

c) Irradiating Insulating Layer with Laser Beam (S13)

Figure 5:
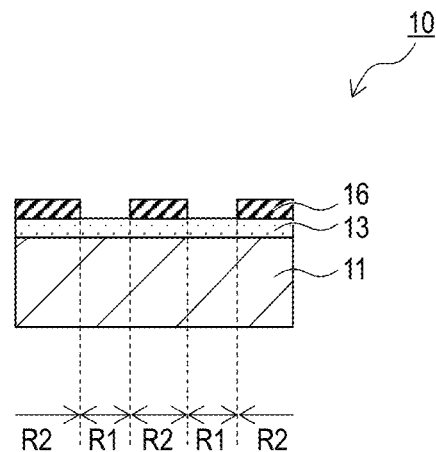
FIG. 5 is a conceptual diagram illustrating a step of irradiating the insulating layer with a laser beam.

By irradiating the insulating layer 16 on the first part R1 of the seed layer 13 with a laser beam, the insulating layer 16 on the first part R1 of the seed layer 13 is removed by laser ablation. Accordingly, as illustrated in FIG. 5, the first part R1 of the seed layer 13 is exposed. Meanwhile, the insulating layer 16 on the second part R2 of the seed layer 13 remains. The irradiation of the insulating layer 16 with the laser beam may be performed by scanning the insulating layer 16 with the laser beam.

The laser beam may be a pulse laser beam. The laser beam may have a wavelength of 580 nm or less and a pulse width of 15 ps or less. As described in Examples below, the use of such a laser beam allows selective removal of the insulating layer 16. Especially, the wavelength of the laser beam may be 400 nm or less. The pulse width of the laser beam may be 1 ps or less. As described in Examples below, the use of such a laser beam allows reduction of debris generation. By using a UV laser having the wavelength of 400 nm or less, a microfabrication of the insulating layer 16 is facilitated, and for example, the formation of the wiring pattern in which Line and Space (L/S) are 5 μm or less is facilitated. The wavelength of the laser beam may be 10 nm or more, and 250 nm or more in some embodiments. The pulse width of the laser beam may be 0.1 ps or more. Here, the pulse width is synonymous with a pulse duration, and means a full width at half maximum (FWHM) in a time intensity distribution of a single pulse.

Other various irradiation conditions of the laser beam including the frequency, the strength, the spot diameter, the spatial intensity distribution, the scanning rate, and the like may be appropriately set depending on the material and the thickness of the insulating layer 16, the material and the thickness of the seed layer 13, the L/S of the wiring pattern of the wiring board to be manufactured, and the like. For example, the laser beam may have a top-hat spatial intensity distribution. This can prevent or reduce partial melting of the insulating layer 16 which may cause a part of insulating layer 16 to be left without being ablated.

Thus, a patterned substrate 10 including the insulating substrate 11, the conductive seed layer 13 disposed on the insulating substrate 11, and an insulating layer 16 disposed on the seed layer 13 is obtained. The seed layer 13 consists of the first part R1 exposed without being coated with the insulating layer 16 and the second part R2 which is a part other than the first part R1, and the insulating layer 16 is disposed on the second part R2. That is, the second part R2 of the seed layer 13 is coated with the insulating layer 16.

(2) Step of Forming Metal Layer (S2)

Figure 6:
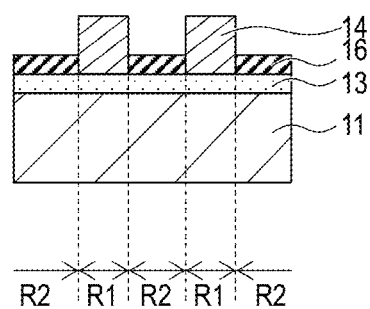
FIG. 6 is a conceptual diagram illustrating a step of forming a metal layer.

As illustrated in FIG. 6, the metal layer 14 is formed on the first part R1 of the seed layer 13. Examples of the material of the metal layer 14 include Cu, Ni, Ag, Au, and the like. The material of the metal layer 14 may be Cu in some embodiments. The metal layer 14 has a thickness larger than that of the insulating layer 16. The metal layer 14 may have the thickness of, for example, 1 to 100 μm.

Figure 9:
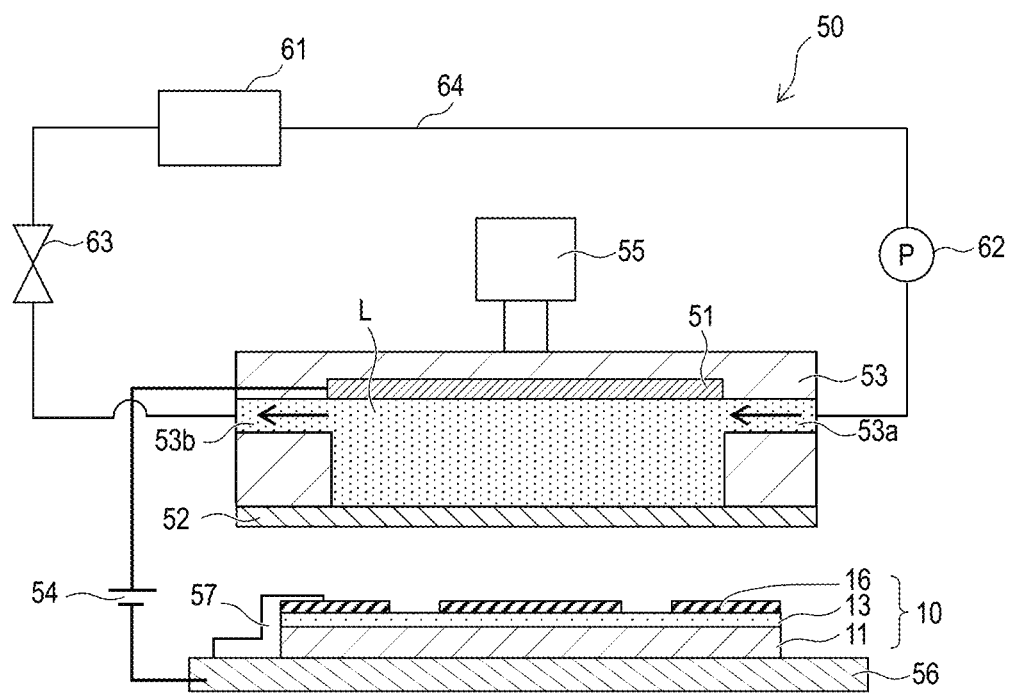
FIG. 9 is a schematic cross-sectional view illustrating a film formation device used in the step of forming the metal layer.
Figure 10:
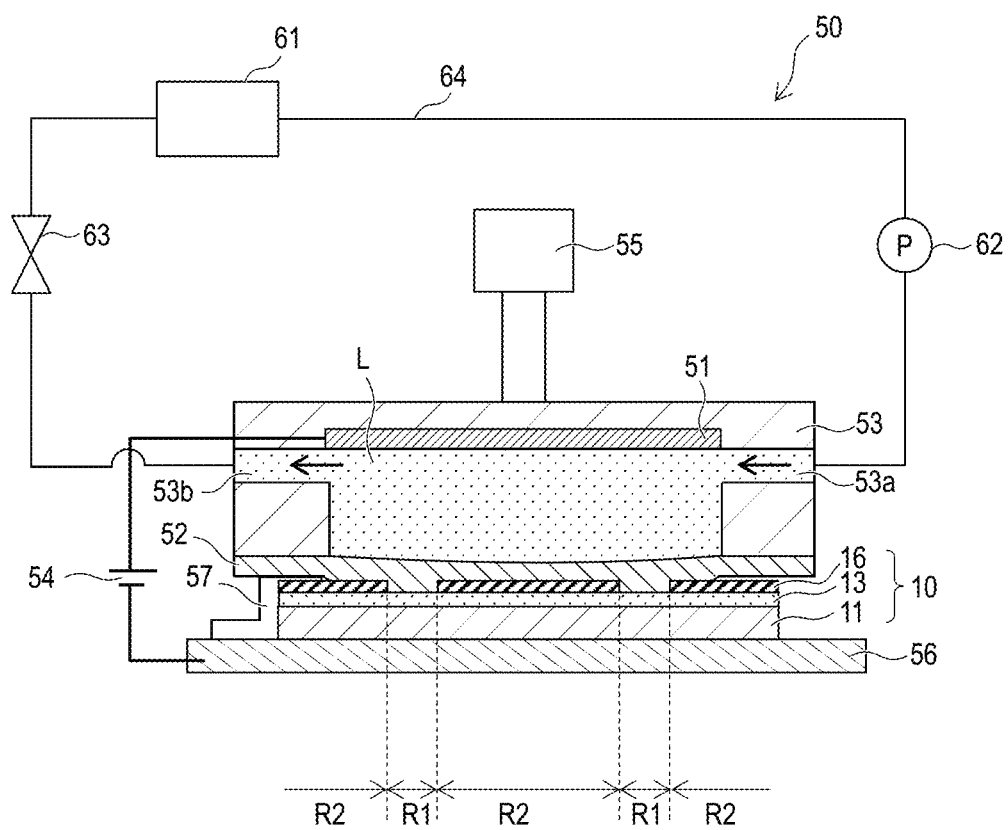
FIG. 10 is a schematic cross-sectional view illustrating the film formation device illustrated in FIG. 9 with a housing moved down to a predetermined height.

An exemplary film formation device 50 used for forming the metal layer 14 is illustrated in FIG. 9 and FIG. 10. The film formation device 50 includes a metallic anode 51 disposed to be opposed to the seed layer 13, a resin film 52 disposed between the anode 51 and the patterned substrate 10, and a power supply unit 54 that applies a voltage between the anode 51 and the seed layer 13.

The film formation device 50 further includes a housing 53. The housing 53 houses the anode 51 and a metal ion-containing solution (hereinafter referred to as a metallic solution) L containing metal ions as a material of the metal layer 14. As illustrated in FIG. 9, the housing 53 may define a space in which the metallic solution L is housed between the anode 51 and the resin film 52. In this case, the anode 51 can be a plate-shaped member formed of a material (for example, Cu) that is the same as the material of the metal layer 14 and is soluble in the metallic solution L, or a plate-shaped member formed of a material (for example, Ti) insoluble in the metallic solution L. In the film formation device 50 in which the metallic solution L is housed between the anode 51 and the resin film 52, the resin film 52 and the patterned substrate 10 can be brought into pressure contact with each other with a uniform pressure, which allows uniform formation of the metal layer 14 on the first part R1 of the seed layer 13 over the whole of the patterned substrate 10. Therefore, the film formation device 50 is appropriate for forming the fine wiring pattern.

While not illustrated in the drawings, the anode 51 may be in contact with the resin film 52. In this case, the anode 51 may be formed of a porous body through which the metallic solution L is permeable, and a surface of the anode 51 opposite to the surface in contact with the resin film 52 may be in contact with the space in which the metallic solution L is housed.

As the resin film 52, a solid-state electrolyte membrane or a porous membrane is usable.

Examples of the solid-state electrolyte membrane include a membrane of a resin having a cation-exchange function, such as a fluorine-based resin (e.g. Nafion (registered trademark) manufactured by DuPont), a hydrocarbon resin, a polyamic acid resin, and Selemion (CMV, CMD, and CMF series) manufactured by AGC Inc.

Examples of the porous membrane include a membrane including a polyolefin chain. Here, polyolefin means all olefin polymers, and encompasses, for example, polyethylene, polypropylene, and a mixture of them. The polyolefin chain may be cross-linked or non-cross-linked, saturated or unsaturated, and linear or branched. The polyolefin chain may be substituted or unsubstituted. In some embodiments, the polyolefin chain can be exemplified by a cross-linked or non-cross-linked polyethylene chain without a side chain. The porous membrane need not have an ion exchange functional group.

The porous membrane may have pore diameters of 20 to 2000 nm, or 27 to 1000 nm. With the pore diameter in the above-described range, the metal layer 14 can be formed with a high current efficiency. Here, the pore diameter means a volume average of a pore diameter distribution. The pore diameter distribution can be obtained with a method of mercury penetration according to Japanese Industrial Standard R 1655: 2003. The method of mercury penetration is a method in which a pressure is applied to cause mercury to enter open pores, a relationship between a volume of the mercury which entered the open pores and a pressure value applied at this time is obtained, and diameters of the open pores are calculated from Washburn's equation based on the obtained results assuming that the open pores have columnar shapes. The porous membrane may have an air permeability of 5 to 500 s/100 cm$^3$ or 10 to 260 s/100 cm$^3$. With the air permeability in the above-described range, the metal layer 14 can be formed with a high current efficiency. The air permeability is measured according to Japanese Industrial Standard L 1096-6-27-1A or ASTM-D737. The porous membrane may have a porosity (degree of porosity) of 35 to 90%, or 45 to 80%. With the porosity in the above-described range, the metal layer 14 can be formed with a high current efficiency. The porosity is a proportion of pores included in a unit volume. Assuming that an apparent density (bulk density) of the porous membrane is $\rho_1$, and a true density (density of the polymer constituting the porous membrane) of the porous membrane is $\rho_2$, a porosity p is expressed as $p=1-\rho_1/\rho_2$. The bulk density pi of the porous membrane can be obtained from a weight and an external volume of the porous membrane. The true density of the porous membrane is measured by a helium gas replacement. The porous membrane may have a tensile strength of 750 to 3000 kgf/cm$^2$, or 1000 to 2400 kgf/cm$^2$. With the tensile strength in the above-described range, a flatter metal layer 14 can be formed. The tensile strength is measured according to Japanese Industrial Standard K 7127: 1999. The porous membrane may have a tensile elongation of 5 to 85%, or 15 to 80%. With the tensile elongation in the above-described range, a flatter metal layer 14 can be formed. The tensile elongation is measured according to Japanese Industrial Standard C 2151 or ASTM D882. As the porous membrane, a commercially available battery separator can be used. The commercially available separator is low cost compared with a solid-state electrolyte membrane, and additionally, further cost reduction is expected.

When the resin film 52 is brought into contact with the metallic solution L, the metallic solution L permeates the resin film 52. Consequently, the resin film 52 internally contains the metallic solution L. The resin film 52 may have a thickness of, for example, about 5 μm to about 200 μm.

The metallic solution L contains a metal (Cu, Ni, Ag, Au, or the like) as the material of the metal layer 14 in the ionic state. The metallic solution L may contain nitrate ions, phosphate ions, succinate ions, sulfate ions, or pyrophosphate ions. The metallic solution L may be an aqueous solution of a metal salt, such as nitrate, phosphate, succinate, hydrosulfate, or pyrophosphate.

Furthermore, the film formation device 50 includes an elevating device 55 that lifts the housing 53 up and down. The elevating device 55 may include a hydraulic or pneumatic cylinder, an electrically operated actuator, a linear guide, a motor, and the like.

The housing 53 is provided with a supply port 53a and a discharge port 53b. The supply port 53a and the discharge port 53b are connected to a tank 61 via a piping 64. The metallic solution L supplied from the tank 61 by a pump 62 connected to the piping 64 flows into the housing 53 through the supply port 53a, is discharged from the housing 53 via the discharge port 53b, and returns to the tank 61. The piping 64 is provided with a pressure adjusting valve 63 in the downstream side of the discharge port 53b. The pressure of the metallic solution L in the housing 53 can be adjusted by the pressure adjusting valve 63 and the pump 62.

The film formation device 50 further includes a metal stage 56 on which the patterned substrate 10 is placed, and a conductive member 57 that electrically connects the seed layer 13 of the patterned substrate 10 and the metal stage 56. The conductive member 57 may be a metal plate that covers a part of an edge portion of the patterned substrate 10 and is partially folded to contact the metal stage 56. Accordingly, the metal stage 56 is electrically connected to the seed layer 13 via the conductive member 57. The conductive member 57 may be removably attachable to the patterned substrate 10.

The power supply unit 54 has a negative electrode electrically connected to the seed layer 13 via the metal stage 56 and a positive electrode electrically connected to the anode 51.

The metal layer 14 can be formed using the film formation device 50 as described below.

As illustrated in FIG. 9, the patterned substrate 10 and the conductive member 57 are placed at a predetermined position on the metal stage 56. Subsequently, as illustrated in FIG. 10, the housing 53 is lowered to a predetermined height by the elevating device 55.

Subsequently, the metallic solution L is pressurized by the pump 62, then the metallic solution L in the housing 53 is kept to a predetermined pressure by the pressure adjusting valve 63. The resin film 52 is deformed to follow the surface of the patterned substrate 10 (i.e., the surfaces of the first part R1 of the seed layer 13 and the insulating layer 16) to be brought in contact with the surfaces of the first part R1 of the seed layer 13 and the insulating layer 16. This allows the metallic solution L contained in the resin film 52 to be brought in contact with the surfaces of the first part R1 of the seed layer 13 and the insulating layer 16. The resin film 52 is uniformly pressed against the surfaces of the first part R1 of the seed layer 13 and the insulating layer 16 by the pressure of the metallic solution L in the housing 53.

A voltage is applied between the anode 51 and the seed layer 13 by the power supply unit 54. This causes reduction of the metal ions contained in the metallic solution L in contact with the first part R1 of the seed layer 13 on the surface of the first part R1 of the seed layer 13 to allow deposition of the metal on the surface of the first part R1 of the seed layer 13. Meanwhile, the metal is not deposited on the surface of the insulating layer 16 since the reduction of the metal ions does not occur there. Accordingly, the metal layer 14 is selectively formed on the first part R1 of the seed layer 13. The voltage applied between the anode 51 and the seed layer 13 may be appropriately set. By applying a higher voltage, a deposition rate of the metal can be increased. The metallic solution L may be heated. This allows the increase of the deposition rate of the metal.

The voltage application between the anode 51 and the seed layer 13 is continued until the metal layer 14 having a predetermined thickness exceeding the thickness of the insulating layer 16 is formed. Even after the thickness of the metal layer 14 exceeds the thickness of the insulating layer 16, the thickness of the metal layer 14 can be further increased while controlling the increase of the size of the metal layer 14 in a horizontal direction (that is, in a direction perpendicular to the thickness direction of the metal layer 14) (see FIG. 6). That is, the metal layer 14 can have an L/S corresponding to the L/S of the pattern of the first part R1 of the seed layer 13. Subsequently, the voltage application between the anode 51 and the seed layer 13 is stopped, and the pressurizing of the metallic solution L by the pump 62 is stopped. Subsequently, the housing 53 is elevated to a predetermined height (see FIG. 9), thereby separating the resin film 52 from the metal layer 14. The patterned substrate 10 on which the metal layer 14 has been formed is removed from the metal stage 56.

(3) Step of Removing Insulating Layer and Second Part of Seed Layer (S3)

Figure 7:
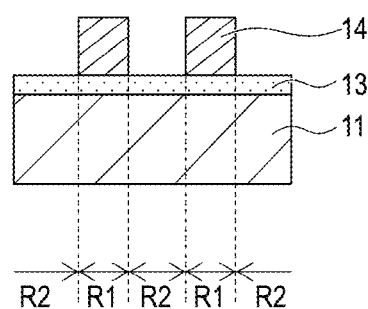
FIG. 7 is a conceptual diagram illustrating a step of removing the insulating layer and a second part of the seed layer.
Figure 8:
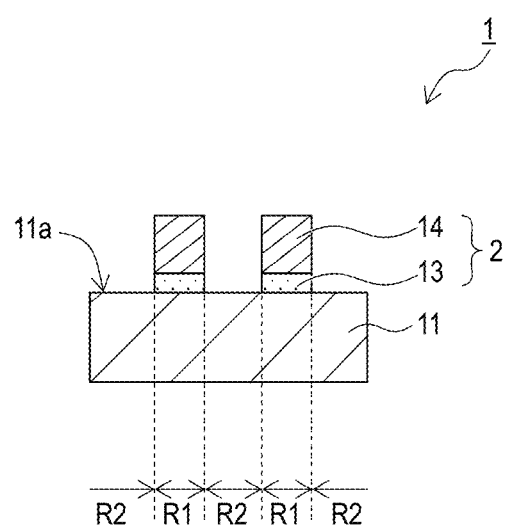
FIG. 8 is a conceptual diagram illustrating a step of removing the insulating layer and the second part of the seed layer.

As illustrated in FIG. 7, the insulating layer 16 is removed, and subsequently, as illustrated in FIG. 8, the second part R2 of the seed layer 13 is removed. Accordingly, a wiring layer 2 having a predetermined wiring pattern and including the first part R1 of the seed layer 13 and the metal layer 14 is formed on the main surface 11a of the insulating substrate 11.

The insulating layer 16 and the second part R2 of the seed layer 13 can be removed by an etching. The method for etching the insulating layer 16 and the second part R2 of the seed layer 13 may be any of a dry or wet etching method. Examples of a dry etching method include a reactive gas etching method, a spatter etching method, a plasma etching method, an ion milling method, a reactive ion etching (RIE) method, a reactive ion beam etching method, a radical etching method, a photoexcitation etching method, a laser assisted etching method, and a laser ablation etching method. For the reactive ion etching method, capacitive coupled plasma (CCP), inductive coupled plasma (ICP), or microwave ECR (Electron Cyclotron Resonance) plasma can be used. An etching gas used for the dry etching may be appropriately selected depending on the respective materials of the insulating layer 16 and the second part R2 of the seed layer 13. Examples of etching gas include $CF_4$, $SF_6$, boron, chlorine, HBr, and $BCl_3$. In the wet etching, a solution of acid or alkali can be used as an etchant. The etchant may be appropriately selected depending on the respective materials of the insulating layer 16 and the second part R2 of the seed layer 13.

As described above, a wiring board 1 that includes the insulating substrate 11 and the wiring layer 2 disposed on the insulating substrate 11 and having the predetermined wiring pattern is manufactured.

In this embodiment, since the metal layer 14 is formed using the film formation device equipped with the resin film 52 as illustrated in FIG. 9 and FIG. 10, the metal layer 14 having the thickness larger than that of the insulating layer 16 can be formed. This allows reduction of the thickness of the insulating layer 16.

Modified Embodiments

The present disclosure is not limited to the embodiment described above, and various changes of design can be made without departing from the spirit of the present disclosure described in the claims. For example, modifications below can be made.

First Modified Embodiment

Figure 11:
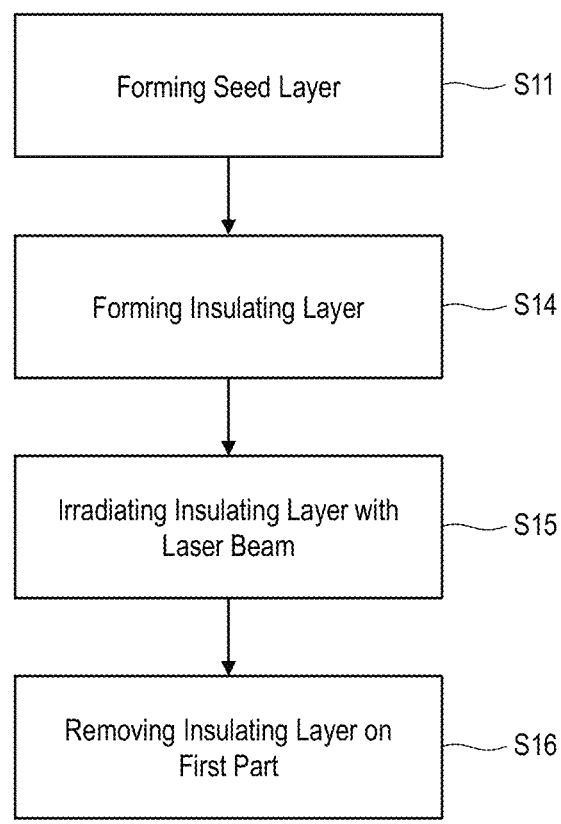
FIG. 11 is a flowchart illustrating a step of preparing a patterned substrate in a method for manufacturing a wiring board according to a first modified embodiment.

In this modified embodiment, a step of preparing the patterned substrate 10 (S1) includes, as illustrated in FIG. 11, a step of forming the seed layer 13 (S11), a step of forming the insulating layer 16 (S14), a step of irradiating the insulating layer 16 with a laser beam (laser light) (S15), and a step of removing the insulating layer 16 on the first part R1 of the seed layer 13 (S16). While the insulating layer 16 on the first part R1 of the seed layer 13 is removed by the laser ablation in the step of irradiating the insulating layer 16 with the laser beam (S13) in the above-described embodiment, the insulating layer 16 on the first part R1 of the seed layer 13 is removed by a photolithography using a laser beam (laser photolithography) in this modified embodiment.

Since the step of forming the seed layer 13 (S11) is similar to the step (S11) in the above-described embodiment, its description is omitted. In this modified embodiment, the thickness of the seed layer 13 may be appropriately set such that the metal layer 14 is uniformly formed over the whole of the patterned substrate 10 in the step of forming the metal layer 14 (S2) and the manufacturing cost of the wiring board 1 is saved.

In the step of forming the insulating layer 16 (S14), a layer of a positive or negative resist is formed as the insulating layer 16. As the positive or negative resist, any resist used in a common photolithography process may be used. Since the method for forming the insulating layer 16 is similar to the method described in the step (S12) of the above-described embodiment, its description is omitted. In this modified embodiment, the thickness of the insulating layer 16 may be appropriately set such that the insulating layer 16 has the sufficient insulating property and can be patterned in the subsequent step (S15) and step (S16).

In the step of irradiating the insulating layer 16 with the laser beam (S15), the insulating layer 16 on any of the first part R1 or the second part R2 of the seed layer 13 is irradiated with the laser beam. The insulating layer 16 on the first part R1 of the seed layer 13 is irradiated with the laser beam when the insulating layer 16 is the positive resist layer, and the insulating layer 16 on the second part R2 of the seed layer 13 is irradiated with the laser beam when the insulating layer 16 is the negative resist layer.

The irradiation of the insulating layer 16 with the laser beam may be performed by scanning the insulating layer 16 with the laser beam. The laser beam may be pulsed or may be a continuous wave (CW). Various irradiation conditions including the wavelength, the strength, the spot diameter, the spatial intensity distribution, the scanning rate, the pulse width, the frequency and the like of the laser beam may be appropriately set depending on the material and the thickness of the insulating layer 16, the L/S of the wiring pattern of the wiring board to be manufactured, and the like. For example, the wavelength of the laser beam may be in a range of 10 to 580 nm, but the wavelength of the laser beam is not limited thereto.

Subsequently, the insulating layer 16 on the first part R1 of the seed layer 13 is dissolved by a developer (developing fluid) and removed (step (S16)), thereby obtaining the patterned substrate 10 as illustrated in FIG. 5. The developer is appropriately selected depending on the material of the insulating layer 16.

Second Modified Embodiment

In this modified embodiment, instead of the laser ablation and the laser photolithography described above, another patterning method (for example, a printing method such as a screen-printing, an ink-jet printing, or a transfer printing, or a photolithography) is employed as the patterning method for the insulating layer 16.

Third Modified Embodiment

Figure 12:
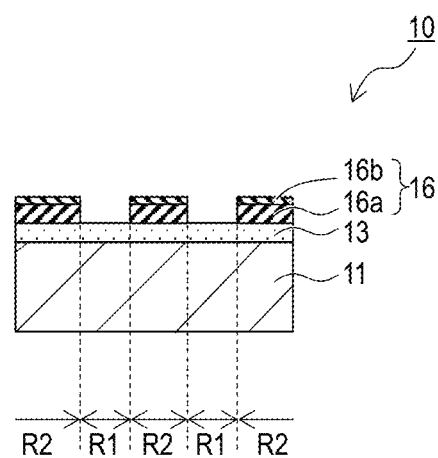
FIG. 12 is a conceptual diagram of a patterned substrate in a method for manufacturing a wiring board according to a third modified embodiment.

In this modified embodiment, in a step of preparing the patterned substrate (S1), a patterned substrate 10 as illustrated in FIG. 12 is prepared. In FIG. 12, the insulating layer 16 includes a main insulating layer 16a formed on the second part R2 of the seed layer 13 and a water-repellent layer 16b formed on the main insulating layer 16a. A water contact angle of the surface of the water-repellent layer 16b may be more than 90 degrees, especially 120 degrees or more. This allows reducing possibility of metal deposition on the insulating layer 16 in the step of forming the metal layer (S2).

The main insulating layer 16a can be formed similarly to the method for forming the insulating layer 16 in the step of forming the insulating layer (S12) in the embodiment or the step of forming the insulating layer (S14) in the first modified embodiment.

Subsequently to the forming of the main insulating layer 16a, the water-repellent layer 16b is formed on the main insulating layer 16a. The water-repellent layer 16b can be formed using an organic silane represented by a formula $SiR_n$—$X_{4-n}$ (in the formula, n indicates 1, 2, 3, or 4, each of R independently represents a substituted or unsubstituted alkyl group, phenyl group, trifluoromethyl group, alkyl silyl group, or fluorosilyl group, and each of X independently represents, hydrogen, halogen, oxygen, or nitrogen), an organic silazane represented by a formula $SiR_3$—$(NR$—$SiR_2)_m$—$R$ (in the formula, m indicates an integer of 1 or more, and each of R independently represents a substituted or unsubstituted alkyl group, phenyl group, trifluoromethyl group, alkyl silyl group, or fluorosilyl group), or the like. Examples of the organic silane include tetraethylsilane, tetramethylsilane, and para-aminophenyltrimethoxysilane. Examples of the organic silazane include hexamethyldisilazane (HMDS).

The water-repellent layer 16b can be formed by any method such as a dip coating method, a mist coating method, a spray coating method, a CVD method, a Langmuir-Blogetto (LB) method, or the like. The mist coating method is a method in which a raw material solution containing a metallic element is atomized using an ultrasonic transducer to form a mist, the mist is supplied to a certain surface, and the mist is decomposed and/or reacted on the surface by a thermal energy or the like, thereby forming a thin film containing the metallic element on the surface.

The insulating layer 16 including the main insulating layer 16a and the water-repellent layer 16b can be patterned by any of the laser ablation method or the laser photolithography as described in the embodiment and the modified embodiment described above, or any other method.

It is also allowable that the patterned main insulating layer 16a is formed by any method, followed by the formation of the water-repellent layer 16b selectively on the main insulating layer 16a.

Examples

While the following specifically describes the present disclosure using Examples, the present disclosure is not limited thereto.

Example 1

As the insulating substrate, a glass epoxy substrate (glass fiber reinforced epoxy laminated material) was prepared. On the main surface of the insulating substrate, a copper film having a thickness of 500 nm was formed as a seed layer by a sputtering method. On the seed layer, a layer of a thermoplastic novolak resin having a thickness of 1.5 to 3 µm was formed as an insulating layer by a spin coating method. A predetermined region of the insulating layer was scanned once with a spot-shaped laser beam (wavelength 355 nm, pulse width 7 ps), thus obtained a patterned substrate having an L/S of 5 µm.

A cross-sectional observation of the patterned substrate was performed using a scanning electron microscope (SEM) to confirm that the insulating layer was removed and the seed layer was exposed in the region scanned with the laser beam, and that the seed layer in the region remained in a state of a continuous film. That is, it was confirmed that the insulating layer was selectively removed (this result is indicated as "Excellent" in Table 1).

The patterned substrate was produced again under the above-described condition, and a Cu layer having a thickness of 5 µm was formed as a metal layer on the surface of the exposed seed layer. Specifically, the Cu layer was formed under the condition below using the film formation device 50 illustrated in FIG. 9 and FIG. 10.

Cathode: seed layer
Anode: oxygen-free copper wire
Resin film: Nafion (registered trademark) (thickness: about 8 µm)
Metallic solution: 1.0 mol/L of copper sulfate aqueous solution
Pressure to press resin film against seed layer: 1.0 MPa
Current density: 0.23 mA/cm$^2$ Next, a capacitive coupled plasma etching was performed using a $CF_4$ gas to remove the insulating layer, and furthermore, etch the seed layer with the metal layer serving as a mask. As a result, a wiring layer having a predetermined wiring pattern including the seed layer and the metal layer was formed on the insulating substrate. Thus, a wiring board including the insulating substrate and the wiring layer was obtained.

Example 2

A wiring board was produced similarly to Example 1 except that the insulating layer was formed by attaching a thermoplastic dry film having a thickness of 7 µm to the seed layer.

By the cross-sectional observation of the patterned substrate using the SEM, it was confirmed that the insulating layer was removed and the seed layer was exposed in the region scanned with the laser beam, and that the seed layer in the region remained in a state of a continuous film. That is, it was confirmed that the insulating layer was selectively removed.

Comparative Example 1

A patterned substrate was produced similarly to Example 1 except that the insulating layer was formed by attaching a thermosetting polyimide film having a thickness of 12.5 µm to the seed layer. The cross-sectional observation of the patterned substrate was performed by the SEM. It was confirmed that the insulating layer remained and the seed layer was not sufficiently exposed in the region scanned with the laser beam. That is, the insulating layer failed to be selectively removed (this result is indicated as "Poor" in Table 1).

Examples 3, 4

Wiring boards were produced similarly to Example 1 except that the thicknesses of the seed layers were as described in Table 1.

By the cross-sectional observation of the patterned substrate using the SEM, it was confirmed that the insulating layer was removed and the seed layer was exposed in the region scanned with the laser beam, and that the seed layer in the region remained in a state of a continuous film. That is, it was confirmed that the insulating layer was selectively removed.

Comparative Examples 2, 3

Patterned substrates were produced similarly to Example 1 except that the thicknesses of the seed layers were as described in Table 1. The cross-sectional observation of the patterned substrate was performed by the SEM. Not only the insulating layer, but also the seed layer was removed in the region scanned with the laser beam, and the seed layer having the sufficient thickness did not remain. That is, the insulating layer failed to be selectively removed.

Example 5

A wiring board was produced similarly to Example 1 except that the wavelength and the pulse width of the laser beam with which the insulating layer was irradiated were as described in Table 1.

By the cross-sectional observation of the patterned substrate using the SEM, it was confirmed that the insulating layer was removed and the seed layer was exposed in the region scanned with the laser beam, and that the seed layer in the region remained in a state of a continuous film. That is, it was confirmed that the insulating layer was selectively removed.

Example 6

A wiring board was produced similarly to Example 1 except that the wavelength and the pulse width of the laser beam with which the insulating layer was irradiated were as described in Table 1.

By the cross-sectional observation of the patterned substrate using the SEM, it was confirmed that the insulating layer was removed and the seed layer was exposed in the region scanned with the laser beam, and that the seed layer in the region remained in a state of a continuous film. That is, it was confirmed that the insulating layer was selectively removed. However, in the patterned substrate, debris which originated form melting and solidification of the insulating layer was seen (this result is indicated as "Good" in Table 1).

Comparative Example 4

A patterned substrate was produced similarly to Example 2 except that the wavelength and the pulse width of the laser beam with which the insulating layer was irradiated were as described in Table 1. The cross-sectional observation of the patterned substrate was performed by the SEM. It was confirmed that the insulating layer remained and the seed layer was not sufficiently exposed in the region scanned with the laser beam. That is, the insulating layer failed to be selectively removed.

Example 7

A wiring board was produced similarly to Example 1 except that a layer of a thermosetting epoxy resin having a thickness of 1.5 to 3 μm was formed as the insulating layer by the spin coating method, and the pulse width of the laser beam with which the insulating layer was irradiated was as described in Table 1.

By the cross-sectional observation of the patterned substrate using the SEM, it was confirmed that the insulating layer was removed and the seed layer was exposed in the region scanned with the laser beam, and that the seed layer in the region remained in a state of a continuous film. That is, it was confirmed that the insulating layer was selectively removed.

Example 8

A wiring board was produced similarly to Example 7 except that a layer of a thermosetting polyimide resin having a thickness of 1.5 to 3 μm was formed as the insulating layer by the spin coating method.

By the cross-sectional observation of the patterned substrate using the SEM, it was confirmed that the insulating layer was removed and the seed layer was exposed in the region scanned with the laser beam, and that the seed layer in the region remained in a state of a continuous film. That is, it was confirmed that the insulating layer was selectively removed.

Example 9

A wiring board was produced similarly to Example 1 except that the wavelength of the laser beam with which the insulating layer was irradiated was as described in Table 1.

By the cross-sectional observation of the patterned substrate using the SEM, it was confirmed that the insulating layer was removed and the seed layer was exposed in the region scanned with the laser beam, and that the seed layer in the region remained in a state of a continuous film. That is, it was confirmed that the insulating layer was selectively removed.

Example 10

Figure 13:
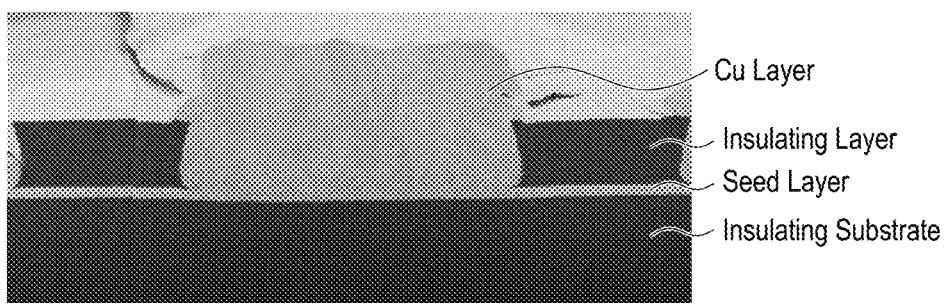
FIG. 13 is a cross-sectional SEM image of a wiring board of Example 10.

A wiring board was produced similarly to Example 1 except that the insulating layer in a predetermined region was eliminated by a laser photolithography. Specifically, the laser photolithography was performed by exposing the predetermined region of the insulating layer by scanning the predetermined region once with a spot-shaped continuous wave laser beam (wavelength 436 nm), and subsequently dissolving the insulating layer in the predetermined region with a developer to remove the insulating layer in the predetermined region. The cross-sectional SEM observation was performed after forming the Cu layer and before removing the insulating layer. FIG. 13 shows a cross-sectional SEM photograph. It was confirmed that the Cu layer having a thickness exceeding the thickness of the insulating layer was formed. The Cu layer had an approximately constant width (i.e., an approximately constant size in horizontal direction) at any height (i.e., at any position in thickness direction).

TABLE 1

|  | Seed Layer Thickness [nm] | Insulating Layer Material | Insulating Layer Thickness [μm] | Laser Wavelength [nm] | Laser Pulse Width [μs] | Selective Removal of Insulating Layer |
|---|---|---|---|---|---|---|
| Example 1 | 500 | Novolak Resin | 1.5 to 3 | 355 | 7 | Excellent |
| Example 2 | 500 | Dry Film | 7 | 355 | 7 | Excellent |
| Comparative Example 1 | 500 | Polyimide Film | 12.5 | 355 | 7 | Poor |
| Example 3 | 300 | Novolak Resin | 1.5 to 3 | 355 | 7 | Excellent |
| Example 4 | 100 | Novolak Resin | 1.5 to 3 | 355 | 7 | Excellent |
| Comparative Example 2 | 50 | Novolak Resin | 1.5 to 3 | 355 | 7 | Poor |
| Comparative Example 3 | 30 | Novolak Resin | 1.5 to 3 | 355 | 7 | Poor |
| Example 5 | 500 | Novolak Resin | 1.5 to 3 | 517 | 0.27 | Excellent |
| Example 6 | 500 | Novolak Resin | 1.5 to 3 | 535 | 15 | Good |
| Comparative Example 4 | 500 | Dry Film | 7 | 1040 | 0.9 | Poor |

TABLE 1-continued

|  | Seed Layer Thickness [nm] | Insulating Layer Material | Insulating Layer Thickness [μm] | Laser Wavelength [nm] | Laser Pulse Width [μs] | Selective Removal of Insulating Layer |
|---|---|---|---|---|---|---|
| Example 7 | 500 | Epoxy Resin | 1.5 to 3 | 355 | 15 | Excellent |
| Example 8 | 500 | Polyimide Resin | 1.5 to 3 | 355 | 15 | Excellent |
| Example 9 | 500 | Novolak Resin | 1.5 to 3 | 266 | 7 | Excellent |
| Example 10 | 500 | Novolak Resin | 1.7 | 436 | — | Excellent |

What is claimed is:

1. A method for manufacturing a wiring board including an insulating substrate and a wiring layer, the wiring layer being disposed on the insulating substrate and having a predetermined wiring pattern, the method comprising:
   preparing a patterned substrate;
      wherein the patterned substrate includes:
         the insulating substrate,
         a conductive seed layer disposed on the insulating substrate, the seed layer consisting of a first part having a predetermined pattern corresponding to the wiring pattern and a second part as a part other than the first part, and
         an insulating layer disposed on the second part of the seed layer;
   forming a metal layer on the first part of the seed layer without being formed on the second part of the seed layer, wherein an uppermost surface of the metal layer is higher than an uppermost surface of the insulating layer,
      wherein the metal layer is formed by disposing a resin film, which is one of a porous membrane or a solid-state electrolyte membrane, and contains a metal ion-containing solution, on the seed layer so that the resin film and the seed layer are in contact with each other, and then applying a voltage between an anode and the seed layer, thereby causing a deposition of the metal of the resin film to deposit on the first part of the seed layer without being deposited on the second part of the seed layer; and
   removing the insulating layer and the second part of the seed layer.

2. The method according to claim 1,
wherein the preparing the patterned substrate includes:
   forming the insulating layer on the first part and the second part of the seed layer; and
   irradiating the insulating layer on the first part with a laser beam to remove the insulating layer on the first part.

3. The method according to claim 2,
wherein the seed layer has a thickness of 80 nm or more.

4. The method according to claim 2,
wherein the laser beam has a wavelength of 580 nm or less and a pulse width of 15 ps or less.

5. The method according to claim 4,
wherein the laser beam has the pulse width of 1 ps or less.

6. The method according to claim 4,
wherein the laser beam has the wavelength of 400 nm or less.

7. The method according to claim 1,
wherein the insulating layer has the thickness of less than 12.5 μm.

8. The method according to claim 1,
wherein the preparing the patterned substrate includes:
   forming the insulating layer on the first part and the second part of the seed layer;
   irradiating the insulating layer on any of the first part or the second part with a laser beam; and
   dissolving the insulating layer on the first part with a developer to remove the insulating layer on the first part.

9. The method according to claim 1,
wherein the insulating layer includes a main insulating layer disposed on the second part of the seed layer and a water-repellent layer disposed on the main insulating layer.

10. The method according to claim 9,
wherein a surface of the water-repellent layer has a water contact angle of more than 90 degrees.

11. The method according to claim 1,
wherein the resin film is a solid-state electrolyte membrane.

* * * * *